United States Patent
Cheon

(10) Patent No.: US 12,150,288 B2
(45) Date of Patent: Nov. 19, 2024

(54) ELECTRONIC DEVICE INCLUDING PCB INCLUDING SHIELDING STRUCTURE, AND PCB

(71) Applicant: Samsung Electronics Co., Ltd., Gyeonggi-do (KR)

(72) Inventor: Hansu Cheon, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 17/746,219

(22) Filed: May 17, 2022

(65) Prior Publication Data

US 2022/0279685 A1 Sep. 1, 2022

Related U.S. Application Data

(63) Continuation of application No. PCT/KR2020/013531, filed on Oct. 6, 2020.

(30) Foreign Application Priority Data

Dec. 30, 2019 (KR) ........................ 10-2019-0177798

(51) Int. Cl.
*H05K 9/00* (2006.01)
*H05K 1/18* (2006.01)

(52) U.S. Cl.
CPC ........... *H05K 9/0024* (2013.01); *H05K 1/181* (2013.01); *H05K 9/0081* (2013.01); *H05K 2201/10431* (2013.01)

(58) Field of Classification Search
CPC ..... G02B 2207/121; H05K 9/00–0098; H05K 9/0024; H05K 1/181; H05K 9/0081;
(Continued)

(56) References Cited

U.S. PATENT DOCUMENTS 7,534,968 B2  5/2009 English et al.
2008/0106884 A1* 5/2008 English ............... H05K 9/0032
361/818
(Continued)

FOREIGN PATENT DOCUMENTS

JP    2008-28342  A     2/2008
JP    2008028342  A  *  2/2008
(Continued)

OTHER PUBLICATIONS

Korean Office Action dated May 20, 2024.

*Primary Examiner* — James Wu
*Assistant Examiner* — Dakota M Talbert
(74) *Attorney, Agent, or Firm* — Cha & Reiter, LLC

(57) ABSTRACT

Disclosed herein is an electronic device and printed circuit board (PCB). The electronic device includes: a housing, the PCB disposed in the housing, a first shielding part including a first shielding member having a closed shape, disposed on a first surface of the PCB, a second shielding part including a second shielding member having a closed shape, a shielding cover covering the first shielding part and the second shielding part, wherein the first shielding member and the second shielding member contact each other at a first location and a second location on the first surface, wherein a third shielding part is defined between the first shielding member and the second shielding member, and wherein the shielding cover is disposed to correspond to the first shielding part, the second shielding part, and the third shielding part.

15 Claims, 7 Drawing Sheets

(58) Field of Classification Search
CPC .......... H05K 2201/10431; H05K 2201/10371; H05K 1/0218; H05K 1/0216; G06F 1/16
See application file for complete search history.

(56) References Cited

U.S. PATENT DOCUMENTS

2012/0262889 A1    10/2012    Tsao
2014/0098500 A1     4/2014    Ogatsu
2018/0199473 A1*  7/2018    Zhang .................. H05K 9/0032

FOREIGN PATENT DOCUMENTS

JP       2013-258378 A    12/2013
KR      10-1737234 B1     5/2017

\* cited by examiner

ELECTRONIC DEVICE INCLUDING PCB INCLUDING SHIELDING STRUCTURE, AND PCB

CROSS-REFERENCE TO RELATED APPLICATION(S)

This application is a continuation of International Application No. PCT/KR2020/013531, which was filed on Oct. 6, 2020, and claims priority to Korean Patent Application No. 10-2019-0177798, filed on Dec. 30, 2019, in the Korean Intellectual Property Office, the disclosures of which are incorporated by reference herein their entirety.

BACKGROUND

Technical Field

The present disclosure relates to electronic devices and printed circuit board (PCB) components thereof, and, more particular, to a shielding structure for a PCB disposed within a device.

Description of Related Art

In an electronic device, a plurality of elements are often mounted on one or more printed circuit boards (PCB). The plurality of elements mounted on the PCB may emit electromagnetic waves.

When the plurality of elements mounted on the PCB emit electromagnetic (EM) waves, the electromagnetic waves emitted from any one of the elements may interfere with operation of other electronic components. This EM interference may cause degradation in the operational performance of the electronic device, and may even cause system errors.

Furthermore, such EM emissions generated by PCB-mounted components may be harmful to human bodies and/or external environments. The electronic device may undergo an electromagnetic compatibility (EMC) test for determining whether EM waves emitted by the electronic device are suitable for the environment before allowing usage of the electronic device. When one or more conditions are not satisfied in the EMC test, the electronic device may be barred from usage.

A shielding structure that blocks EM waves may be added to reduce mutual EM interference between the plurality of components, and protect a user of the electronic device from EM emissions. For example, a shield can may be disposed on the PCB to block the EM waves generated by the plurality of elements. The shield can may reduce mutual EM interference and reduce the emissions of EM waves to an external environment of the electronic device, by covering certain areas of the PCB.

To implement the shielding structure, one or more shielding spaces may be formed by covering the PCB with one or more shielding frames. For example, one shielding space may be formed on an interior of one shield can by covering the PCB with the shield can. When the shielding spaces are covered with the plurality of shielding frames, the number of the plurality of shielding frames typically matches the number of the shielding spaces, and thus, there is often an increase in costs for shielding materials for implementing the shielding structure.

Furthermore, in implementing the shielding structure, the shielding space may be formed by bending the shielding frames to form shielding walls. When the shielding walls are formed by bending, openings may be inadvertently formed in areas of the same where bending occurs. When these openings are formed, the shielding performance of the shielding structure may be reduced.

SUMMARY

Certain embodiments disclosed in the disclosure provide an electronic device including a PCB including a shielding structure that decreases costs for materials and improves a performance of shielding electromagnetic waves, and a PCB thereof.

According to certain embodiments of the disclosure, an electronic device is disclosed herein, including: a housing, a printed circuit board (PCB) disposed in an interior of the housing, a first shielding part including a first shielding member having a closed shape, disposed on a first surface of the PCB and facing a first direction perpendicular to a plane of the first surface, a second shielding part including a second shielding member having a closed shape, disposed on the first surface of the PCB, when viewed from a top of the first surface, a shielding cover covering the first shielding part and the second shielding part, wherein the first shielding member and the second shielding member contact each other at a first location and a second location on the first surface, wherein a third shielding part is defined between the first shielding member and the second shielding member, and wherein the shielding cover is disposed to correspond to the first shielding part, the second shielding part, and the third shielding part.

According to certain embodiments of the disclosure, a PCB is disclosed herein, including: a first shielding part including a first shielding member having a closed shape, disposed on a first surface of the PCB, and facing a first direction that is perpendicular to a plane of the first surface, a second shielding part including a second shielding member having a closed shape, disposed on the first surface of the PCB, when viewed from the top of the first surface, and a shielding cover covering the first shielding part and the second shielding part, wherein the first shielding member and the second shielding member contact each other at a first location and a second location on the first surface, wherein a third shielding part is defined in a gap defined between the first shielding member and the second shielding member, and wherein the shielding cover is disposed to correspond to the first shielding part, the second shielding part, and the third shielding part.

According to embodiments disclosed in the disclosure, the first shielding part, the second shielding part, and the third shielding part may be formed by disposing the first shielding member and the second shielding member in the PCB of the electronic device. Accordingly, because three shielding spaces may be formed by using two shielding frames, costs for materials for implementing the shielding structure of the electronic device may be reduced.

Furthermore, according to embodiments disclosed in the disclosure, the first shielding member and the second shielding member may be formed in a closed shape as the first shielding member and the second shielding member contact each other at the first location and the second location in the PCB of the electronic device. Accordingly, by avoiding formation of inadvertent openings in the shielding members, a net improvement in shielding performance may be attained.

In addition, the disclosure may provide various effects that are directly or indirectly recognized.

BRIEF DESCRIPTION OF THE DRAWINGS

With regard to description of drawings, the same or similar components may be marked by the same or similar reference numerals.

DETAILED DESCRIPTION

Hereinafter, certain embodiments of the disclosure will be described with reference to the accompanying drawings. Accordingly, those of ordinary skill in the art will recognize that modification, equivalent, and/or alternative on the certain embodiments described herein can be variously made without departing from the disclosure.

Figure 1:
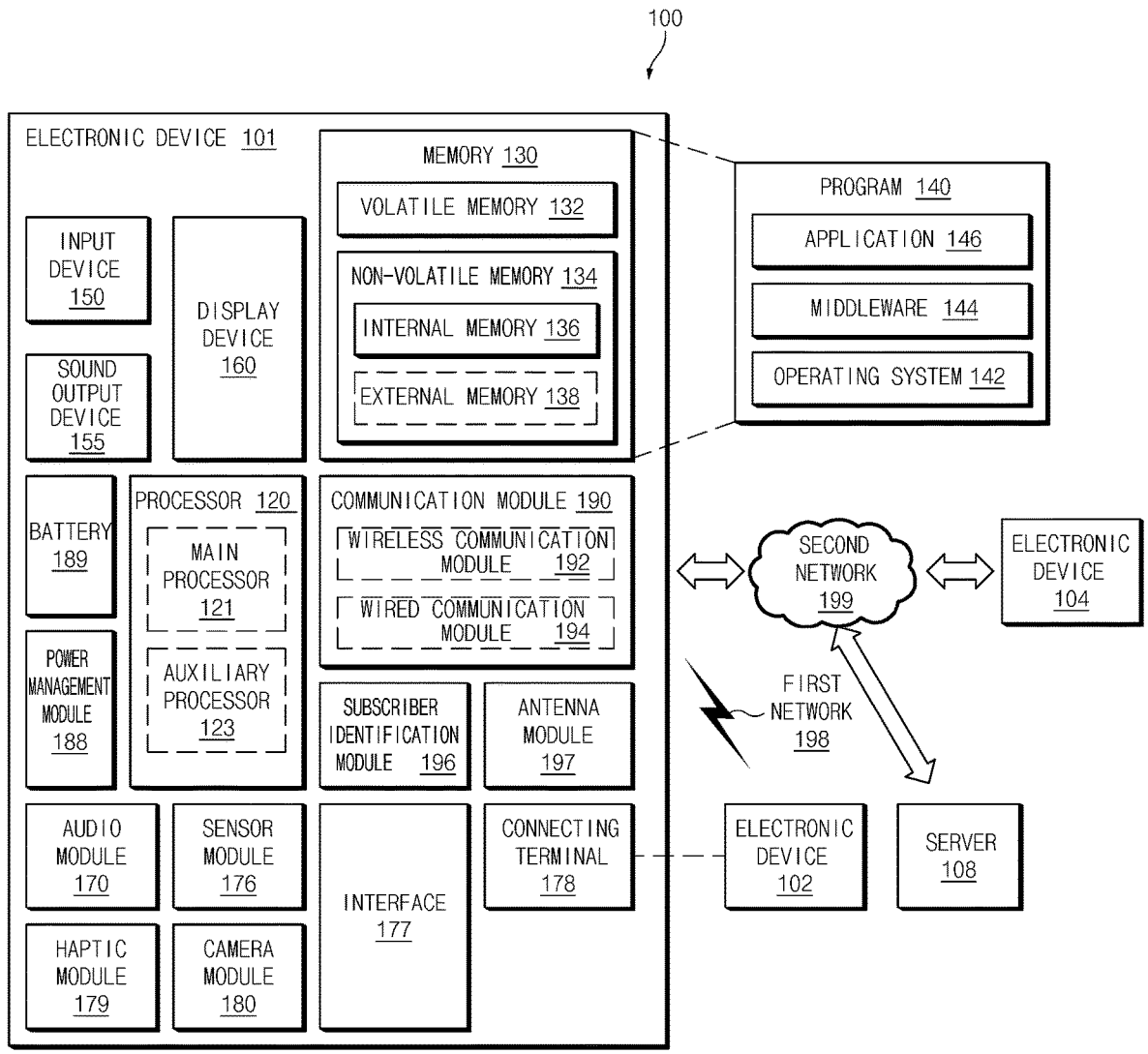
FIG. 1 is a block diagram illustrating an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., by wire) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
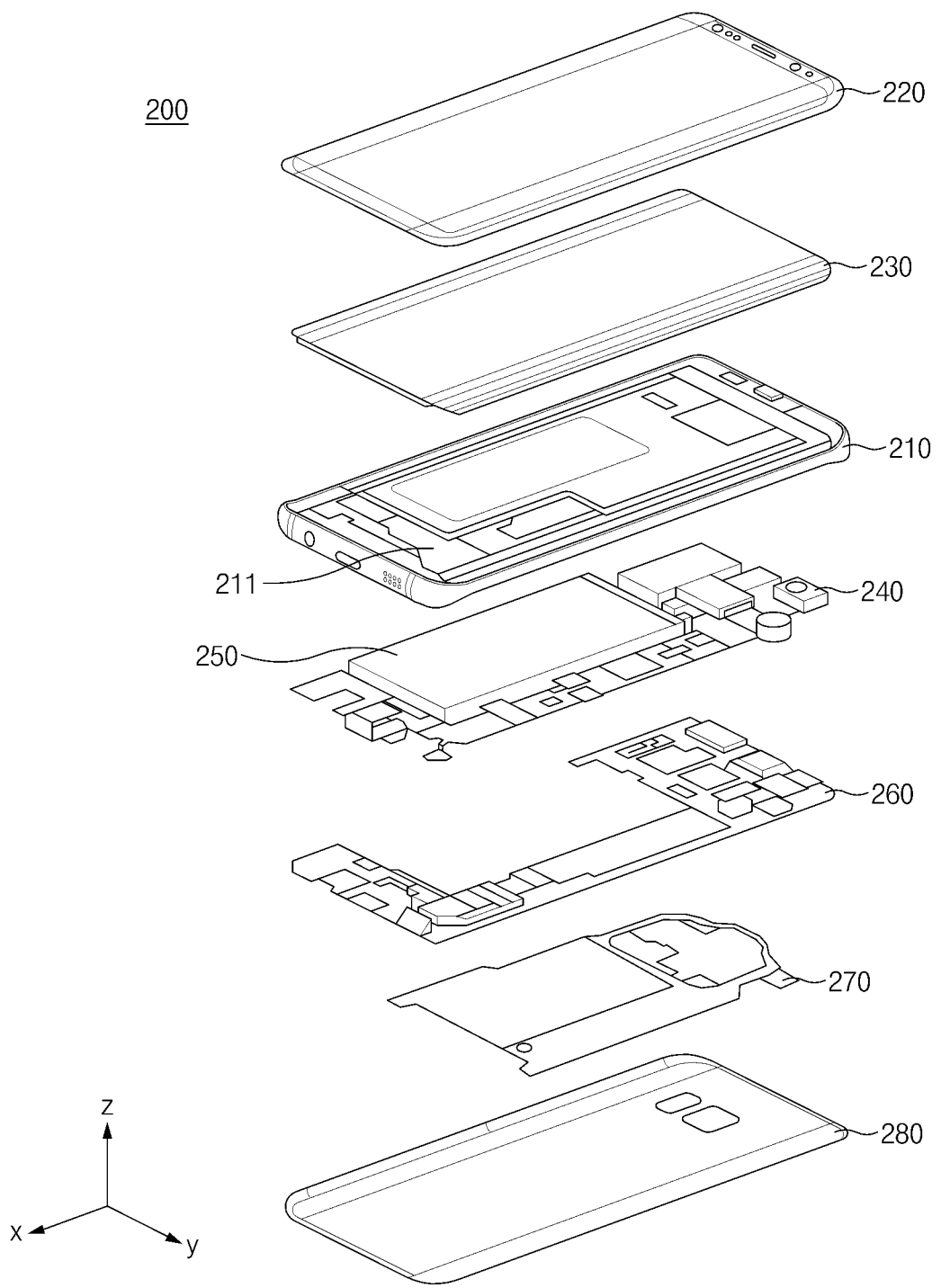
FIG. 2 is an exploded perspective view of an electronic device according to an embodiment.

FIG. 2 is an exploded perspective view of an electronic device (e.g., the electronic device 101 of FIG. 1) according to an embodiment. The electronic device 101 according to an embodiment may be a portable terminal device, such as a smartphone. The electronic device 101 according to an embodiment may include a housing, a first support member 211 (e.g., a bracket), a display 230, a printed circuit board (PCB) 240, a battery 250, a second support member 260 (e.g., a rear case), and an antenna 270.

The housing may define an external appearance of a first surface (or a front surface) of the electronic device 101, a second surface (or a rear surface) of the electronic device 101, and side surfaces of the electronic device 101 between the first surface and the second surface. The housing may include a front plate 220 that faces a first direction (the +Z direction), a rear plate 280 that faces a second direction (the −Z axis direction) that is opposite to the first direction (the +Z axis direction), and a side member 210 that surrounds a space formed between the front plate 220 and the rear plate 280. The front plate 220 may include a glass plate or a polymer plate including various coating layers. The rear plate 280, for example, may be formed of coated or colored glass, ceramics, a polymer, a metal (e.g., aluminum, stainless steel (STS), or magnesium), or a combination of at least two thereof. The side member 210 may include a metal and/or a nonmetal (e.g., a polymer), and may have a side bezel structure.

The first support member 211 may be disposed in the interior of the electronic device 101 so as to be connected to the side member 210 or to be integrally formed with the side member 210. The first support member 211, for example, may be formed of a metallic material and/or a nonmetallic material (e.g., a polymer). The display 230 may be coupled to one surface of the first support member 211, and the PCB 240 may be coupled to an opposite surface of the first support member 211.

The display 230 may display a screen. The display 230 may be coupled to or be disposed to be adjacent to a touch detection circuit, a pressure sensor that measures intensity (e.g., a pressure) of a touch, and/or a fingerprint sensor.

A plurality of elements may be mounted on the PCB 240. In an embodiment, a processor (e.g., the processor 120 of FIG. 1), a memory (e.g., the memory 130 of FIG. 1), and/or an interface (e.g., the interface 177 of FIG. 1) may be mounted on the PCB 240. The processor 120, for example, may include one or more of a central processing unit (CPU), an application processor (AP), a graphic processing unit (GPU), an image signal processor (ISP), a sensor hub processor (SHP), or a communication processor (CP). The memory 130 may include a volatile memory (e.g., the volatile memory 132 of FIG. 1) or a nonvolatile memory (e.g., the nonvolatile memory 134 of FIG. 1). The interface 177 may include a high definition multimedia interface (HDMI), a universal serial bus (USB) interface, an SD card interface, or an audio interface. The interface 177 may electrically or physically connect the electronic device 101 to an external electronic device (e.g., the electronic device 102 and 104 of FIG. 1), and may include a USB connector, an SD card/MMC connector, or an audio connector.

The battery 250 may supply power to at least one element of the electronic device 101. The battery 250 may include a primary cell that cannot be recharged, a secondary cell, or a fuel cell. At least a portion of the battery 250 may be disposed on an XY plane that is parallel to or substantially the same as a plane of the PCB 240. The battery 250 may be integrally disposed in the interior of the electronic device 101, and may be disposed to be detachable from the electronic device 101.

The antenna 270 may be disposed between the rear plate 280 and the battery 250. The antenna 270 may include a near field communication (NFC) antenna, a wireless charging antenna, and/or a magnetic secure transmission (MST) antenna. The antenna 270 may perform short-range communication with the external device 102, or may wirelessly transmit and receive electric power that is necessary for charging. In another embodiment, an antenna structure may be formed by one or a combination of the side member 210 and/or the first support member 211.

Figure 3:
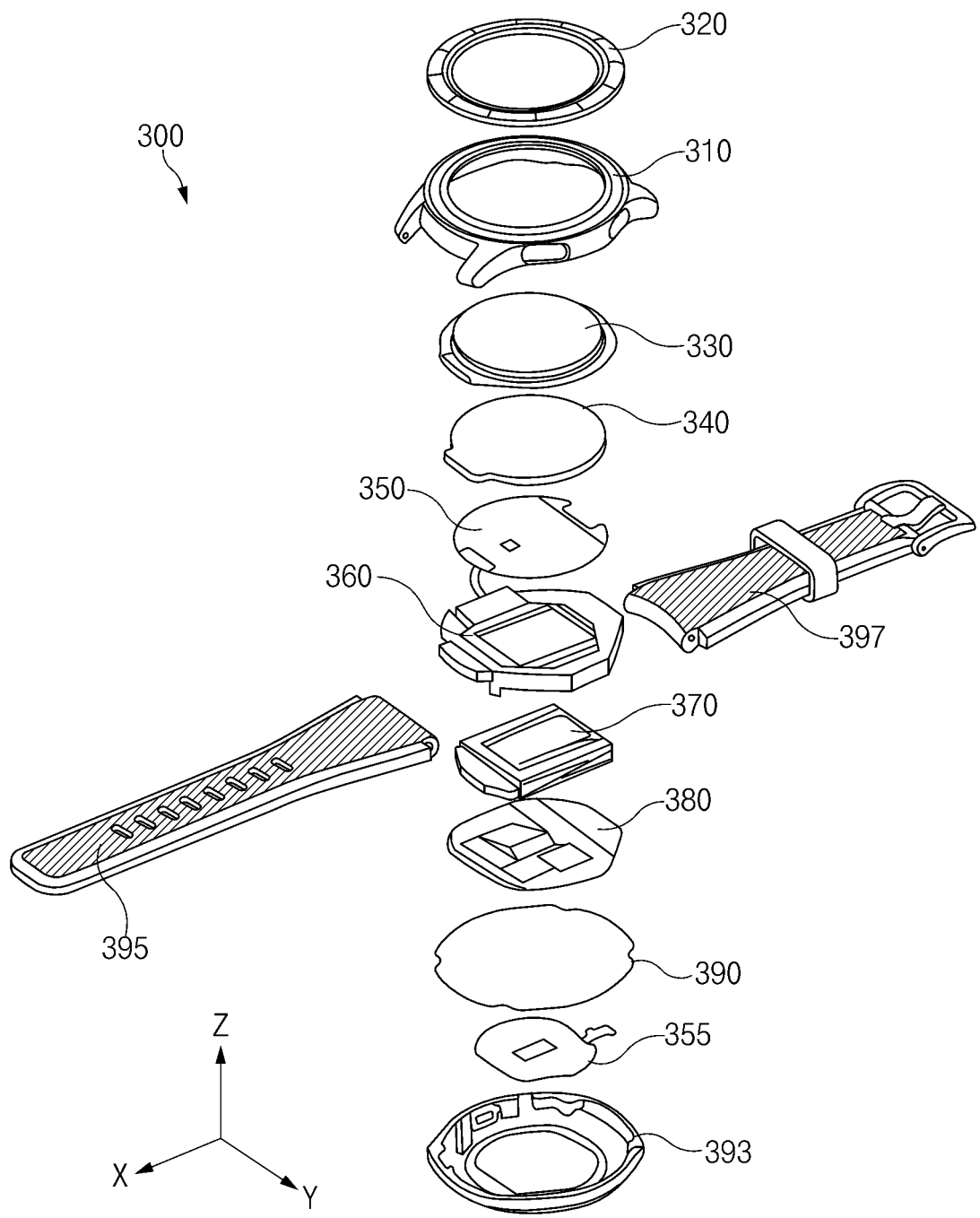
FIG. 3 is an exploded perspective view of an electronic device according to another embodiment.

FIG. 3 is an exploded perspective view 300 of the electronic device (e.g., the electronic device 101 of FIG. 1) according to another embodiment. The electronic device 101 according to another embodiment may include a wearable terminal device, such as a smart watch. The electronic device 101 according to an embodiment may include a housing, a wheel key 320, a display 340, a first antenna 350, a second antenna 355, a support member 360 (e.g., a bracket), a battery 370, a PCB 380, a sealing member 390, and fastening members 395 and 397.

The housing may define external appearances of a first surface (or a front surface) of the electronic device 101, a second surface (or a rear surface) of the electronic device 101, and side surfaces of the electronic device 101 between the first surface and the second surface. The housing may include a front plate 330 that faces a first direction (the +Z direction), a rear plate 393 that faces a second direction (the −Z axis direction) that is an opposite direction to the first direction (the +Z axis direction), and a side member 310 that surrounds a space between the front plate 330 and the rear plate 393. The front plate 330 may include a glass plate or a polymer plate including various coating layers. The rear plate 393, for example, may be formed of coated or colored glass, ceramics, a polymer, a metal (e.g., aluminum, stainless steel (STS), or magnesium), or a combination of at least two thereof. The side member 310 may include a metal and/or a nonmetal (e.g., a polymer), and may have a side bezel structure.

The wheel key 320 may be disposed on the first surface of the housing, and may be rotated in at least one direction. The wheel key 320 may include a shape corresponding to the shape of the front plate 330.

The display 340 may be visible through most of the front plate 330. A shape of the display 340 may correspond to the shape of the front plate 330. The display 340 may have various shapes, such as a circular shape, an elliptical shape, or a polygonal shape.

The first antenna 350 may be disposed between the display 340 and the support member 360. The first antenna 350 may include an NFC antenna, a wireless charging antenna, and/or an MST antenna. The first antenna 350 may perform short-range communication with an external device (e.g., the electronic device 102 of FIG. 1), or may wirelessly transmit and receive electric power for charging. The first antenna 350 may transmit magnetism-based signals including short range communication signals or payment data.

The second antenna 355 may be disposed between the PCB 380 and the rear plate 393. The second antenna 355 may include an NFC antenna, a wireless charging antenna, and/or an MST antenna.

The support member 360 may be disposed in the interior of the electronic device 101 to be connected to the side member 310 or to be integrally formed with the side member 310. The display 340 may be coupled to one surface of the support member 360, and the PCB 380 may be coupled to an opposite surface of the support member 360. The battery 370 may supply power to at least one element of the electronic device 101. A plurality of elements may be mounted on the PCB 380.

The sealing member 390 may be disposed between the side member 310 and the rear plate 393. The sealing member 390 may prevent moisture and foreign substances from intruding into the internal space formed by the side member 310 and the rear plate 393, from an external environment.

The fastening members 395 and 397 may be fastened to at least a partial area of the housing so as to be detachable. The fastening members 395 and 397 may fix the electronic device 101 to a portion (e.g., a wrist, an ankle, or the like) of a body of a user.

Figure 4:
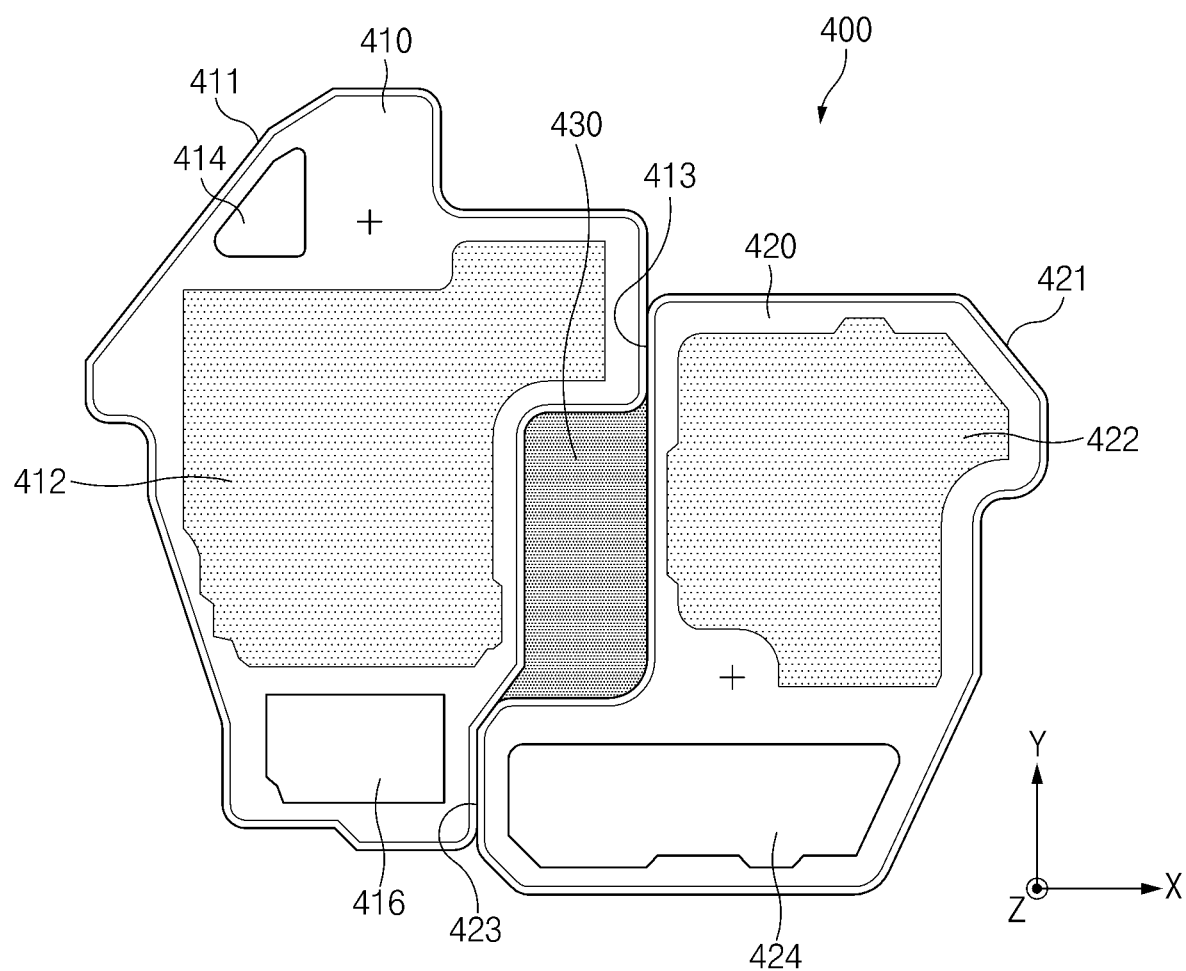
FIG. 4 is a view illustrating a first shielding part, a second shielding part, and a third shielding part of an electronic device according to an embodiment.

FIG. 4 is a view 400 illustrating a first shielding part 410, a second shielding part 420, and a third shielding part 430 of the electronic device (e.g., the electronic device 101 of FIG. 1) according to an embodiment.

In an embodiment, the PCB (e.g., the PCB 240 of FIG. 2 and/or the PCB 380 of FIG. 3) may be disposed in the interior of the housing (e.g., the housing of FIG. 2 and/or the housing of FIG. 3).

In an embodiment, the PCB 240 or 380 may include a first surface that faces the first direction (the +Z axis direction). A plurality of elements 412, 414, 416, 422, and 424 may be disposed on the first surface of the PCB 240 or 380. The plurality of elements 412, 414, 416, 422, and 424 may include various electronic components. A bonding pad, on which various electronic components are mounted, and a circuit that is printed to electrically connect the mounted electronic components, may be provided on the first surface of the PCB 240 or 380. When the electronic device 101 is operated, the electronic components may generate electromagnetic waves.

In an embodiment, the first shielding part 410 may be disposed on the first surface of the PCB 240 or 380, which faces the first direction (the +Z axis direction). The first shielding part 410 may include a first shielding member 411. The first shielding member 411 may be disposed on the first surface of the PCB 240 or 380, which faces the first direction (the +Z axis direction). The first shielding member 411 may extend toward the first direction (the +Z axis direction) on the first surface of the PCB 240 or 380. The first shielding member 411 may have a partition wall that is disposed on the first surface of the PCB 240 or 380, that extends upright in the first direction (the +Z axis direction). A height of the first shielding member 411 in the first direction (the +Z axis direction) may be substantially uniform.

In an embodiment, the first shielding member 411 may have a closed shape when viewed from a top of the first surface. The first shielding member 411 may be integrally formed without any opening, separation, cut, or bending portion in a direction on an XY plane, which is a direction that is perpendicular to the first direction (the +Z axis direction) and is parallel to the first surface, on the first surface. The first shielding part 410 may define a first shielding space in a closed space by the first shielding member 411. The first shielding part 410 may interrupt electromagnetic waves generated by the at least one element 412, 414, and 416 disposed in the closed space by the first shielding member 411.

In an embodiment, the first shielding member 411 may be formed of a metallic material, such as stainless steel and/or titanium. The first shielding member 411 may be fixed to the first surface of the PCB 240 or 380 through soldering, bonding, a clip, screw-coupling, or a surface mount device (SMD).

In an embodiment, the second shielding part 420 may be disposed on the first surface of the PCB 240 or 380, which faces the first direction (the +Z axis direction). The second shielding part 420 may include a second shielding member 421. The second shielding member 421 may be disposed on the first surface of the PCB 240 or 380, which is disposed so as to face the first direction (the +Z axis direction). The second shielding member 421 may extend toward the first direction (the +Z axis direction) on the first surface of the PCB 240 or 380. The second shielding member 421 may include a partition wall that is disposed on the first surface of the PCB 240 or 380 and stands upright extending in the first direction (the +Z axis direction). A height of the second shielding member 421 in the first direction (the +Z axis direction) may be substantially uniform. A height of the second shielding member 421 in the first direction (the +Z axis direction) may be substantially the same as the height of the first shielding member 411 in the first direction (the +Z axis direction).

In an embodiment, the second shielding member 421 may have a closed shape when viewed from a top of the first surface. The second shielding member 421 may be integrally formed so as to be without any opened, separated, cut, or bent portions along the XY plane, which is perpendicular to the first direction (the +Z axis direction) and is parallel to the first surface. The second shielding part 420 may define a second shielding space in a closed space by the second shielding member 421. The second shielding part 420 may interrupt electromagnetic waves generated by the at least one element 422 and 424 disposed in the closed space by the second shielding member 421.

In an embodiment, the second shielding member 421 may be formed of a metallic material, such as stainless steel and/or titanium. The second shielding member 421 may be fixed to the first surface of the PCB 240 or 380 through soldering, bonding, a clip, screw-coupling, or a surface mount device.

In an embodiment, the first shielding member 411 and the second shielding member 421 may contact each other at a first location 413 and a second location 423 on the first surface. The first location 413 and the second location 423 may be spaced apart from each other. The first location 413 and the second location 423 may also be formed along the XY plane that is parallel to the first surface and perpendicular to the first direction (the +Z axis direction), on the first surface. The first shielding member 411 and the second shielding member 421 may include structures that are opened, separated, cut, or bent at the first location 413 and the second location 423, or may be closed without any gaps therebetween.

In an embodiment, a space may be defined between the first shielding member 411 and the second shielding member 421. The first shielding member 411 and the second shielding member 421 may define a space on the first surface of the PCB 240 or 380, when viewed from a top of the first surface. For example, when the first shielding member 411 has an "L" shape, and the second shielding member 421 has an inverse "L" shape, a rectangular space may thus be defined between the first shielding member 411 and the second shielding member 421. However, the disclosure is not limited thereto, and when borders of the first shielding member 411 and the second shielding member 421 have shapes that do not correspond to each other, a space may be defined between the first shielding member 411 and the second shielding member 421.

In an embodiment, by the first shielding member 411, the second shielding member 421, the first location 413, and the second location 423, the third shielding part 430 may be defined between the first shielding member 411 and the second shielding member 421. The third shielding part 430 may be disposed on the first surface of the PCB 240 or 380, which faces the first direction (the +Z axis direction). The third shielding part 430 may occupy the space defined between the first shielding member 411 and the second shielding member 421 as a third shielding space. The third shielding part 430 may shield electromagnetic waves generated by at least one element disposed in the third shielding space.

Figure 5:
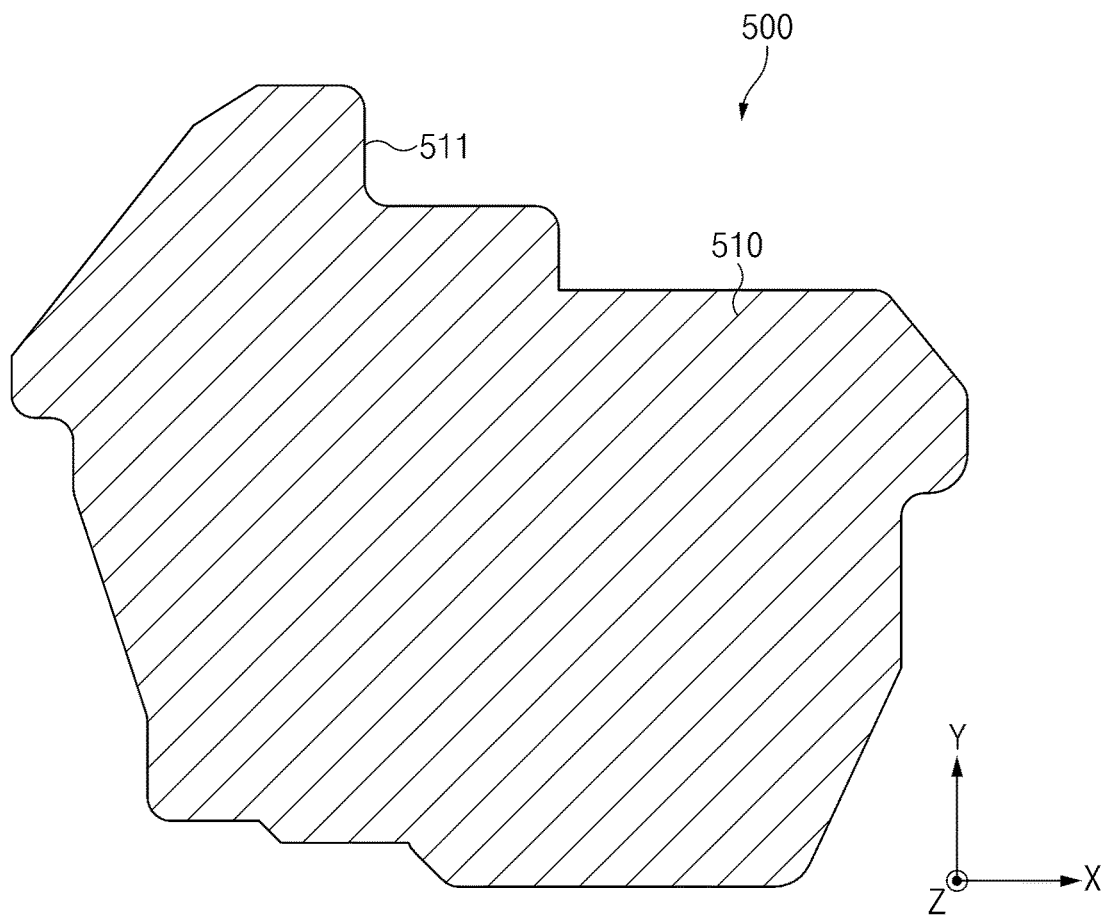
FIG. 5 is a view of a shielding cover of an electronic device according to an embodiment.

FIG. 5 is a view 500 illustrating a shielding cover 510 of the electronic device (e.g., the electronic device 101 of FIG. 1).

In an embodiment, the shielding cover 510 may cover the first shielding part (e.g., the first shielding part 410 of FIG. 4) and the second shielding part (e.g., the second shielding part 420 of FIG. 4) from the top of the first surface of the PCB (e.g., the PCB 240 of FIG. 2 and/or the PCB 380 of FIG. 3). The shielding cover 510 may have a first periphery 511 in a direction of the XY plane. The shielding cover 510 may have a closed shape when viewed from the top of the first surface. The shielding cover 510 may have shapes that are integrally formed without any opened, separated, cut, or bent portions along an XY plane, which parallel to the first direction (the +Z axis direction). The shielding cover 510 may have a thickness that is uniform on a plate parallel to the XY plane and perpendicular to the first direction (the +Z axis direction). The shielding cover 510 may be formed of any material having a sufficient electrical conductivity, such as stainless steel. The shielding cover 510 may include a conductive tape.

Figure 6:
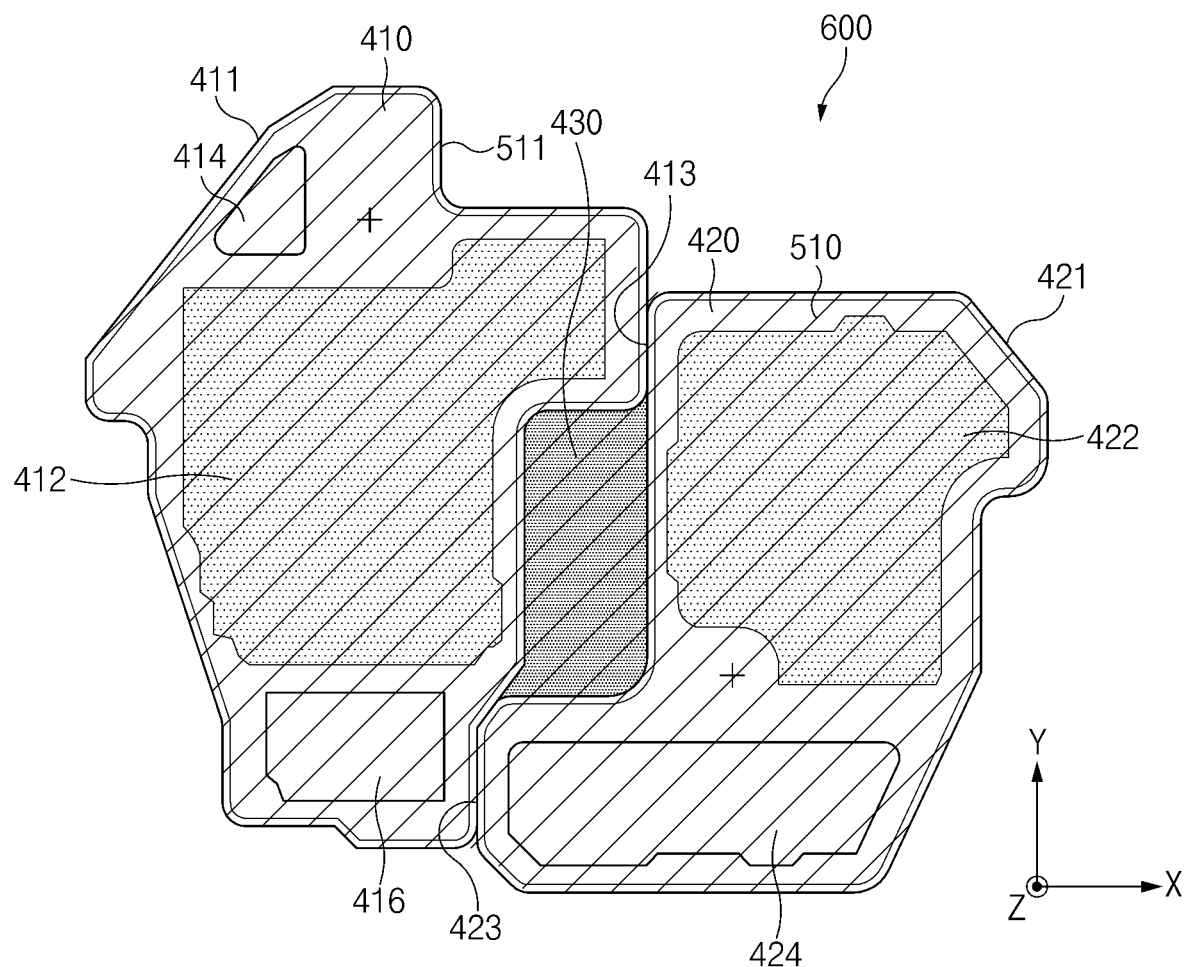
FIG. 6 is a view illustrating a first shielding part, a second shielding part, a third shielding part, and a shielding cover of an electronic device according to an embodiment.

FIG. 6 is a view 600 illustrating the first shielding part 410, the second shielding part 420, the third shielding part 430, and the shielding cover 510 of the electronic device (e.g., the electronic device 101 of FIG. 1) according to an embodiment.

In an embodiment, the shielding cover 510 may be disposed to correspond to the first shielding part 410, the second shielding part 420, and the third shielding part 430 in the first direction (the +Z axis direction). The first periphery 511 of the shielding cover 510 may be disposed to correspond to portions of the first shielding member 411 and the second shielding member 421, except for a portion that defines the third shielding part 430, in the first direction (the +Z axis direction).

In an embodiment, the shielding cover 510 may close the first shielding space, the second space, and the third space in the first direction (the Z axis direction). The shielding cover 510 may be coupled to the first shielding member 411 and the second shielding member 421 and include a continuous, closed structure, lacking any gaps, openings, separations, cuts or bending.

Figure 7:
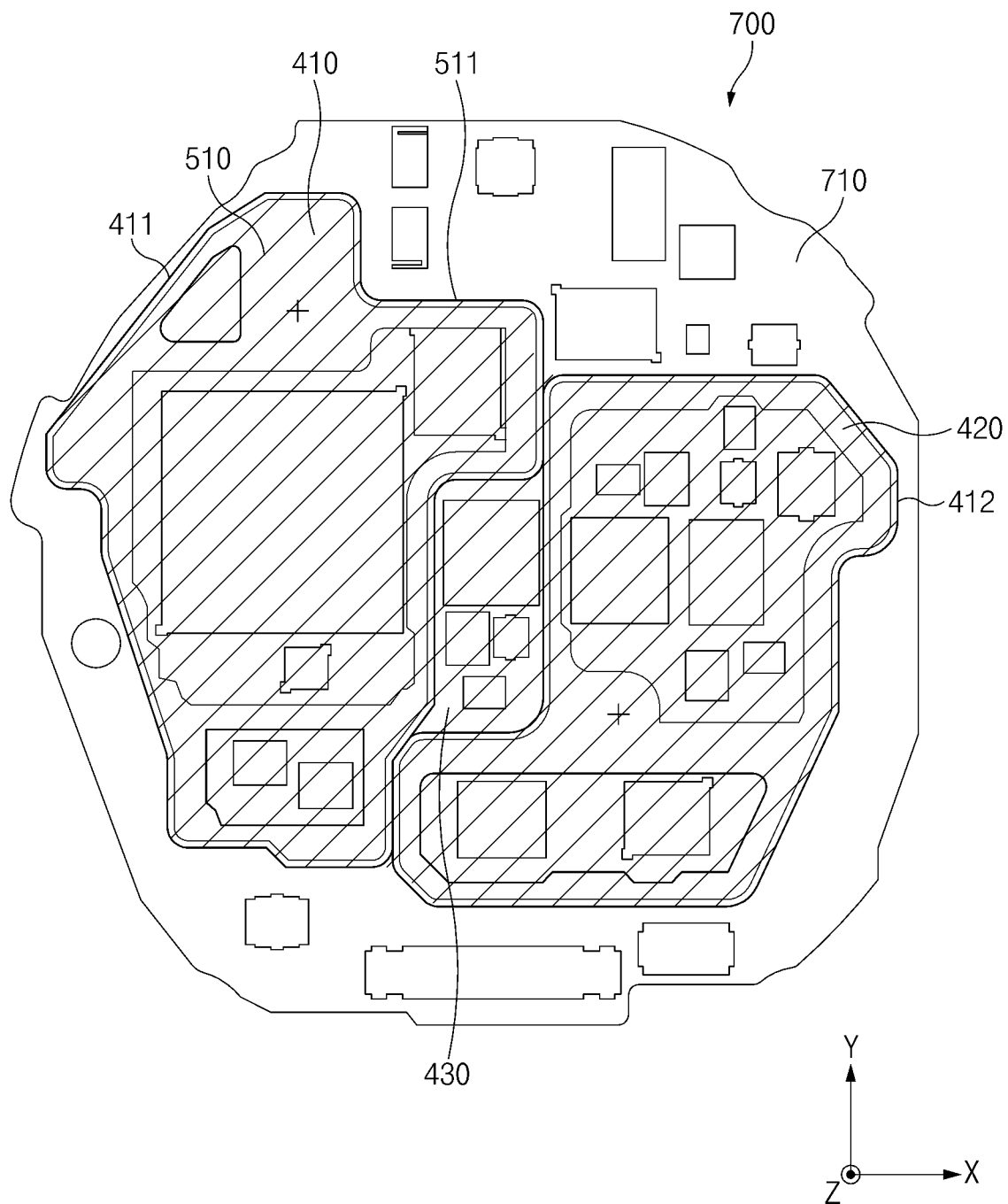
FIG. 7 is a view illustrating a PCB of an electronic device according to an embodiment.

FIG. 7 is a view 700 illustrating the PCB (e.g., the PCB 240 of FIG. 2 and/or the PCB 380 of FIG. 3) of the electronic device (e.g., the electronic device 101 of FIG. 1).

In an embodiment, a first area 710 is illustrated that may be at least a partial area of the first surface of the PCB 240 or 380, which may be the first direction (the +Z axis direction), and may be an electromagnetic wave shielding area. The first area 710 of the PCB 240 or 380 may be covered by the shielding cover 510. The first shielding part 410, the second shielding part 420, and the third shielding part 430 may be defined in the shielding cover 510.

In an embodiment, the first shielding part 410, the second shielding part 420, and the third shielding part 430 may be defined by using the first shielding member 411, the second shielding member 421, and the shielding cover 510. The three shielding spaces may be defined by the two shielding members and the one shielding cover. When the concept of the disclosure (e.g., described with reference to FIGS. 4 to 7) is applied in a wide aspect, by using N (N being an integer of 2 or more) shielding members (e.g., the first shielding member 411 and the second shielding member 421 of FIG. 4) and one shielding cover 510, (N+1) shielding parts (e.g., the first shielding part 410, the second shielding part 420, and the third shielding part 430) may be defined. Accordingly, costs for materials for defining the plurality of shielding spaces on the PCB 240 or 380 may be reduced.

In an embodiment, the first shielding member 411 and the second shielding member 421 may contact each other at the first location 413 and the second location 423. In an embodiment, by the first shielding member 411, the second shielding member 421, the first location 413, and the second location 423, the first shielding part 410, the second shielding part 420, and the third shielding part 430 may be formed of material sheets having closed, continuous shapes. Accordingly, shielding performance between the shielding spaces defined in the PCB may be increased.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., by wire), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
    a housing;
    a printed circuit board (PCB) disposed in an interior of the housing;
    a first shielding part including a first shielding member having a closed shape, disposed on a first surface of the PCB and facing a first direction perpendicular to a plane of the first surface;
    a second shielding part including a second shielding member having a closed shape, disposed on the first surface of the PCB, when viewed from a top of the first surface; and
    a shielding cover covering the first shielding part and the second shielding part,
    wherein the first shielding member includes a first portion, and a second portion protruding more toward the second shielding member than the first portion,
    wherein the second shielding member includes a third portion contacting the second portion at a first location, and a fourth portion protruding more toward the first shielding member than the third portion and contacting the first portion at a second location,
    wherein a third shielding part is defined between the first shielding member and the second shielding member, and
    wherein the shielding cover is disposed to correspond to the first shielding part, the second shielding part, and the third shielding part.

2. The electronic device of claim 1, wherein the first shielding member and the second shielding member include partition walls disposed on the first surface of the PCB, and extending upright in the first direction.

3. The electronic device of claim 1, wherein respective heights of the first shielding member and the second shielding member are substantially the same.

4. The electronic device of claim 1, wherein the first shielding member and the second shielding member are integrally formed as a whole sheet, in absence of opening, separating, cutting and bending, and is disposed substantially parallel to the plane of the first surface.

5. The electronic device of claim 1, wherein the first shielding member and the second shielding member include a metallic material.

6. The electronic device of claim 1, wherein the first shielding member and the second shielding member are affixed to the first surface of the PCB through at least one of soldering, bonding, a mechanical clip, a mechanical screw-coupling, or a surface mount device (SMD).

7. The electronic device of claim 1, wherein the first shielding member and the second shielding member both include a closed structure at the first and second locations, in absence of opening, separating, cutting and bending.

8. The electronic device of claim 1, wherein the shielding cover is integrally formed in absence of opening, separating, cutting and bending relative to a plane of the first surface.

9. The electronic device of claim 1, wherein the shielding cover is formed of stainless steel.

10. The electronic device of claim 1, wherein the shielding cover includes a conductive tape.

11. A printed circuit board (PCB) disposed in an interior of a housing of an electronic device, the PCB comprising:
    a first shielding part including a first shielding member having a closed shape, disposed on a first surface of the PCB, and facing a first direction that is perpendicular to a plane of the first surface;
    a second shielding part including a second shielding member having a closed shape, disposed on the first surface of the PCB, when viewed from a top of the first surface; and
    a shielding cover covering the first shielding part and the second shielding part,
    wherein the first shielding member includes a first portion, and a second portion protruding more toward the second shielding member than the first portion, wherein the second shielding member includes a third portion contacting the second portion at a first location, and a fourth portion protruding more toward the first shielding member than the third portion and contacting the first portion at a second location, wherein a third shielding part is defined in a gap defined between the first shielding member and the second shielding member, and wherein the shielding cover is disposed to correspond to the first shielding part, the second shielding part, and the third shielding part.

12. The PCB of claim 11, wherein the first shielding member and the second shielding member include partition walls disposed on the first surface of the PCB and extending upright in the first direction.

13. The PCB of claim 11, wherein respective heights of the first shielding member and the second shielding member are substantially the same.

14. The PCB of claim 11, wherein the first shielding member and the second shielding member are integrally formed as whole sheets in absence of opening, separating, cutting or bending, and is disposed substantially parallel to the plane of the first surface.

15. The PCB of claim 11, wherein the first shielding member and the second shielding member include a metallic material.

* * * * *